United States Patent [19]

Richter et al.

[11] Patent Number: 5,783,368
[45] Date of Patent: Jul. 21, 1998

[54] METHOD OF FORMING CONDUCTIVE PATHS ON A SUBSTRATE CONTAINING DEPRESSIONS

[75] Inventors: Horst Richter, Böblingen; Walter Jörg, Stuttgart; Johann Springer, Aichwald, all of Germany

[73] Assignee: Alcatel N.V., Rijswijk, Netherlands

[21] Appl. No.: 570,314

[22] Filed: Dec. 11, 1995

[30] Foreign Application Priority Data

Dec. 24, 1994 [DE] Germany ............... 44 46 509.2

[51] Int. Cl.⁶ ................................................ G03C 5/00
[52] U.S. Cl. ........................... 430/315; 430/313; 430/314
[58] Field of Search ............................... 430/313, 314, 430/396, 315

[56] References Cited

U.S. PATENT DOCUMENTS

| 5,105,055 | 4/1992 | Mooney et al. ................. 174/27 |
| 5,268,066 | 12/1993 | Tabasky et al. ................. 156/633 |
| 5,344,545 | 9/1994 | Tsukada et al. ................ 204/415 |
| 5,526,454 | 6/1996 | Mayer .............................. 385/49 |

FOREIGN PATENT DOCUMENTS

| 0607881 | 7/1994 | European Pat. Off. ......... G02B 6/42 |
| 3812414 | 10/1989 | Germany ....................... H01B 13/00 |
| 4212208 | 10/1993 | Germany ....................... G02B 6/30 |
| 4312881 | 3/1994 | Germany ....................... G02B 6/12 |
| 4402082 | 8/1994 | Germany ....................... H01L 25/64 |
| 4402422 | 9/1994 | Germany ....................... G02B 6/30 |
| 221507 | 9/1989 | United Kingdom .............. G03F 7/00 |

OTHER PUBLICATIONS

Patent Abstracts of Japan, vol. 14, No. 557 (E–1011 (Dec. 11, 1990) and JP–A–02 239638, Sep. 21, 1990 (Toppan Printing Co. Ltd.).
"Einfuhrung in die Leiterplattentechnologie", M. Hummel, Eugen G. Leuze Verlag, Saulgau/Wurtt., 1985, pp. 93–95.
"Optoelektroische Mikrosysteme", G. Benz, *Elektronik*, vol. 21, 1993, pp. 134, 137, 138, 140–142.

*Primary Examiner*—George F. Lesmes
*Assistant Examiner*—Steven H. Ver Steeg
*Attorney, Agent, or Firm*—Ware Fressola, Van Der Sluys & Adolphson LLP

[57] ABSTRACT

The invention concerns a method of forming a number of electric conductors at a very short distance from the end of depressions such as V-grooves on a substrate. In one configuration example, a film of PTFE or of a similar material is laminated over the entire surface of the substrate. Holes are etched in the film. The holes are metallized. Conductive paths are formed, which are electrically connected to the metallized holes. The film in the area of the grooves is removed by etching. In another configuration example, the grooves are temporarily filled with a photoresist and the conductive paths and contact surfaces are formed in accordance with a photolithographic method.

9 Claims, 3 Drawing Sheets

1

METHOD OF FORMING CONDUCTIVE PATHS ON A SUBSTRATE CONTAINING DEPRESSIONS

TECHNICAL FIELD

The invention concerns a method of forming conductive paths and/or contact bumps of a highly electrically conductive material, at a very short distance from the end of depressions made in a substrate.

BACKGROUND OF THE INVENTION

In electronic circuits such as optoelectronic hybrid circuits, optoelectronic components equipped with electrical contacts are arranged on a silicon substrate, to which optical waveguides are coupled. The optical waveguides are arranged in V-grooves. Since the optoelectronic components like semiconductor lasers or diodes represent the opticelectronic connecting link, the electric lines and/or contacts leading to them, with which they are connected by means of the flip-chip-technique for example, must be located at a very short distance from the end of the V-grooves. This distance is on the order of 50 μm for example, and the depth of the V-groove at 700 μm. The depressions in the substrate make the forming of conductive paths and/or contact bumps more difficult, because of the considerable unevenness of the substrate surface. The technical problem underlying the invention is therefore to present a method whereby the conductive paths and/or contact bumps can be formed with the required quality in regard to size and distance.

DISCLOSURE OF INVENTION

The invention solves this technical problem in that the depressions are temporarily closed and the conductive paths and/or contact bumps are subsequently formed in accordance with a photolithographic process.

If the depressions, for example the V-grooves for receiving the optical waveguides, are closed during the formation of the conductive paths and/or contact bumps, i.e. the unevenness of the substrate is flattened out, it is possible to form them with the required quality by using the known photolithographic process.

The depressions can be filled with photoresist, covered with a plastic sheet, or other such ways of temporarily closing the depressions. A radio-frequency line in the form of a microstrip may be formed from the conductive paths or the plastic sheet. After the formation of the conductive paths in this way, contact bumps may be formed on the conductive paths. The above-mentioned plastic sheet may be made of a polyimide or a fluorocarbon polymer. The plastic sheet may be used as a mask in patterning a metal layer.

These and other objects, features and advantages of the present invention will become more apparent in light of the detailed description of a best mode embodiment thereof, as illustrated in the accompanying drawing.

BEST MODE FOR CARRYING OUT THE INVENTION

Figure 1:
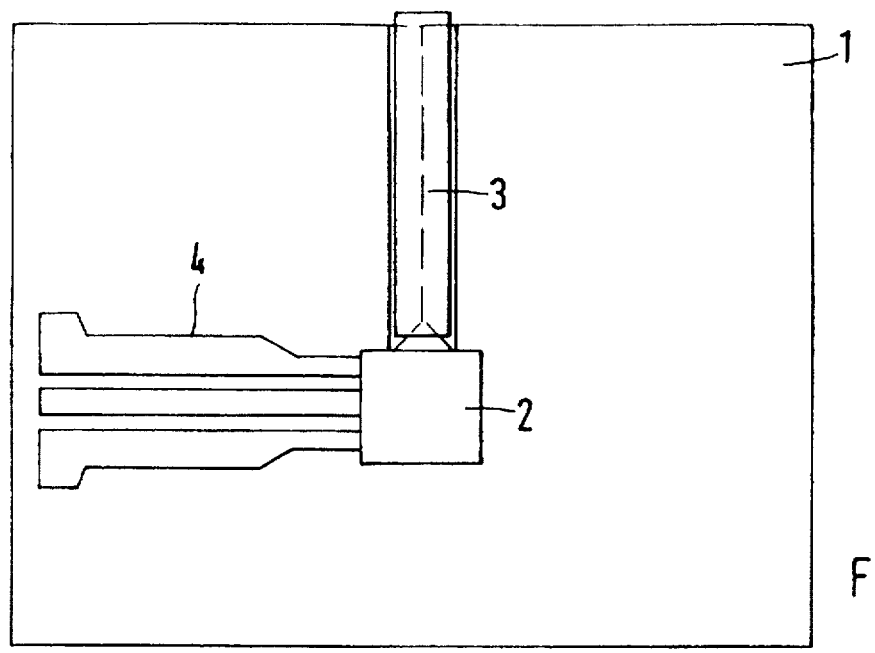
FIG. 1 is a top view of a substrate on which a semiconductor laser is coupled to an optical waveguide.

As can be seen in FIG. 1, a substrate 1 supports a semiconductor laser 2 or a different optoelectronic component, to which an optical waveguide or fiber 3 which is located in a V-groove, is coupled. An electric contact with the semiconductor laser 2 is provided by conductive paths 4. An end of the conductive paths 4 is equipped with (not illustrated) contact bumps made of a highly conductive material, which establish an electrically conductive connection with corresponding contacts in the semiconductor laser 2.

Figure 2A:
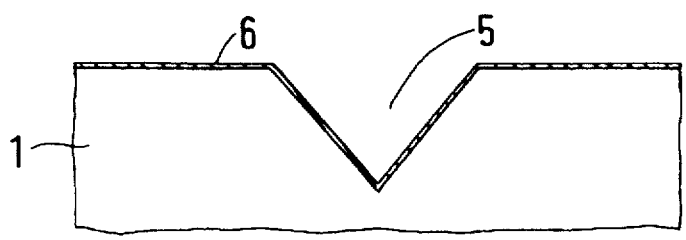
FIGS. 2A to 2G are cross sections through the substrate during different formation stages of the electric conductive paths in one configuration example.

FIG. 2A illustrates a cross section of substrate 1 in the area of a V-groove 5, before formation of the conductive paths or contact bumps has begun. A surface of substrate 1 may be covered by a 1 μm thin metal layer 6, made of gold for example.

Figure 2B:
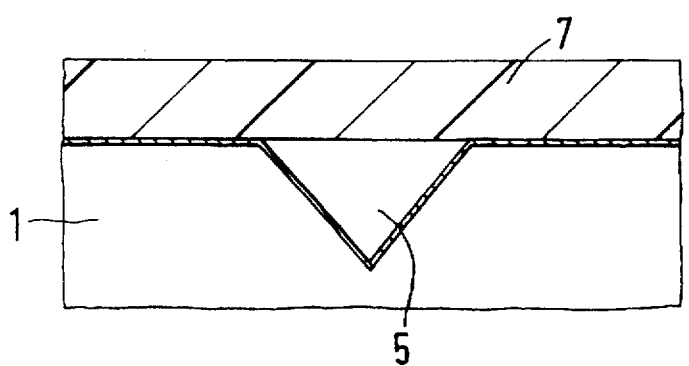

FIG. 2B illustrates the same cross section as FIG. 2A, after a film 7 with an adhesive coating has been laminated to the surface of substrate 1. The film 7 can be made of PTFE, polyimide or another material with similar properties, and may have a thickness of between 25 and 200 μm, for example. Because of its strength, it stretches over the V-groove or other depressions so that they are closed temporarily.

Figure 2C:
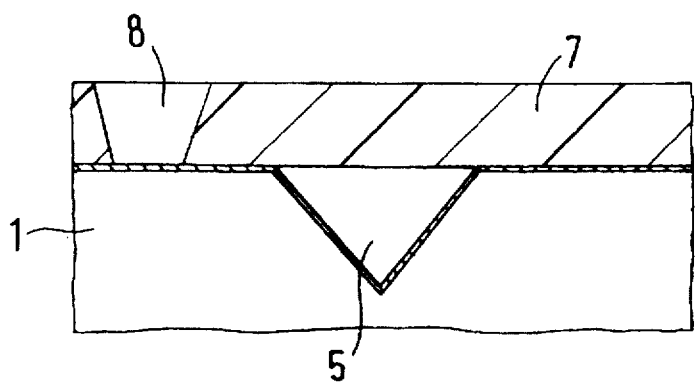

FIG. 2C illustrates the substrate 1 after an opening 8, which reaches down to the metal layer 6, has been made in one area of the film 7, through which contact with the metal layer is established. This opening 8 can be made by reactive ion etching (RIE etching) for example, using a correspondingly structured lithographic mask.

Figure 2D:
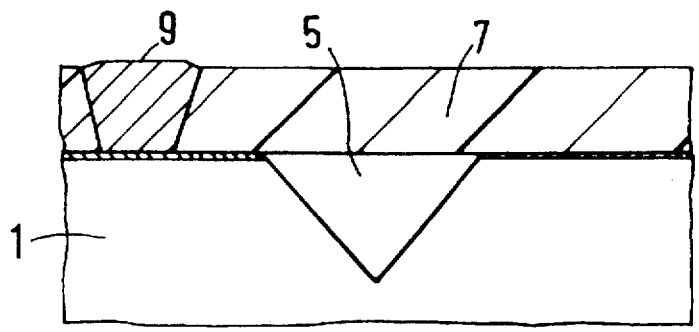

FIG. 2D illustrates the substrate 1 after the opening 8 has been filled with a column 9 made of metal. Suitable metals are copper or nickel, which can be deposited without current, for example. The column 9 can also be produced through galvanic metal deposition, which is not difficult if the film is made of PTFE, and a closed metal layer for supplying current is placed under the film.

Figure 2E:
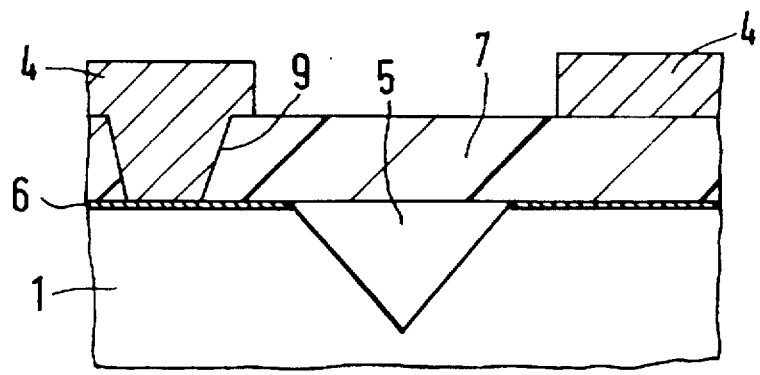

FIG. 2E illustrates the substrate 1 after conductive paths 4 have been formed on the film surface. These conductive paths can be formed photolithographically in the known manner by means of the subtractive or semi-additive technique, whereby contact with the metal layer 6 can also be established through the column 9. Other structures, such as contact bumps, can be formed by successive steps according to the thin-film multilayer technique.

Figure 2F:
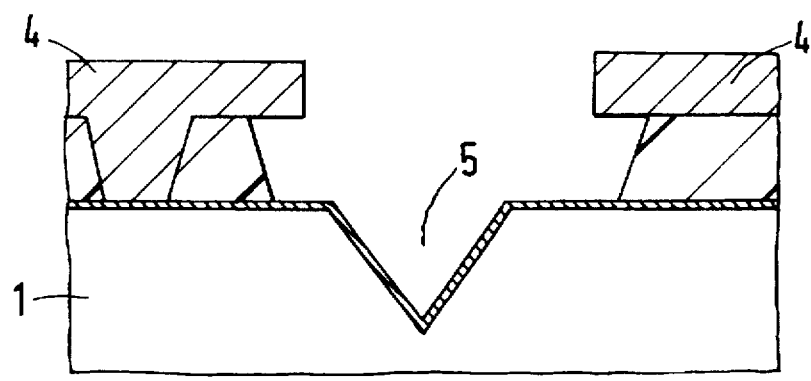

FIG. 2F illustrates the substrate 1 after the film 7 has been eliminated from every area where it had not been covered by conductive paths 4, which served as etching protectors. Again, the etching can be by means of the RIE etching method. The conductive paths 4 exhibit good high frequency characteristics, because they are partly surrounded by air or by the film 7 with an equally low dielectric constant.

Figure 2G:
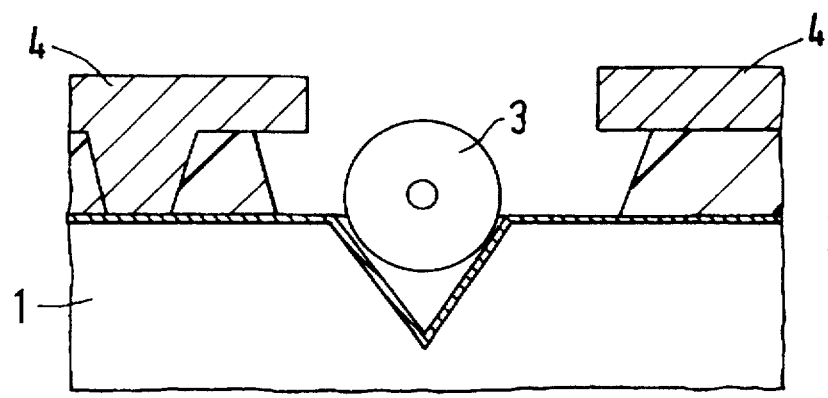

FIG. 2G illustrates an almost final stage of the substrate 1, after the V-groove 5 has been opened and the optical waveguide 3 has been placed into it. The component, for example a semiconductor laser, can now be contacted by the conductive paths 4. Contact bumps (not illustrated), such as can be formed in the manner of the configuration example in FIGS. 3C to 3E, can serve that purpose.

If required, the metal layer 6, which still fully covers the substrate at this stage of the process, can also be structured by means of further lithographic process steps; however, the structure is not very precise in the vicinity of the depressions. If a precise structure of the metal layer 6 is required, the plastic film can be structured (e.g. by laser ablation) in the desired pattern, and used as an etching mask. Possible plastic film residues could subsequently be removed by RIE.

FIGS. 3A to 3F illustrate the substrate 1 after different successive steps in another configuration of the method of forming the conductive paths and/or contact bumps.

Figure 3A:
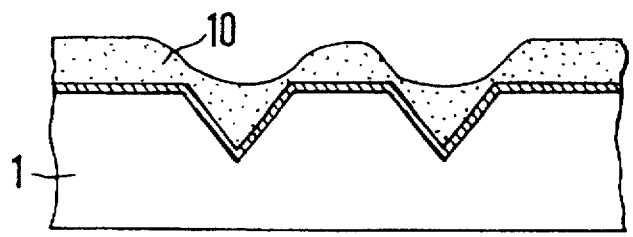
FIGS. 3A to 3F are cross sections through the substrate during different formation stages of the electric conductive paths in another configuration example.

FIG. 3A illustrates the substrate 1 with the V-grooves and the metal layer arranged on the surface of substrate 1, as already described in connection with FIG. 2A. In contrast to FIG. 2B, FIG. 3A shows that the surface of substrate 1 is covered with a layer 10 of photoresist, which is applied by rollers, silk screening or similar methods.

Figure 3B:
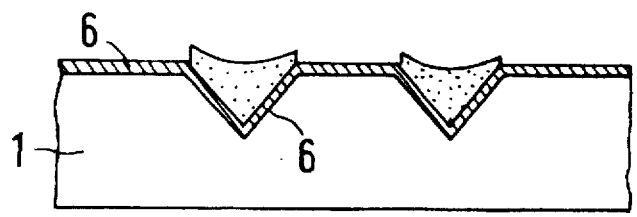

FIG. 3B illustrates the substrate 1 according to FIG. 3A, after the layer 10 of photoresist has been exposed and developed, and the exposed and developed part of the photoresist layer has been removed. This step of the process is performed in a way so that the photoresist in the V-grooves is not exposed, developed or removed.

Figure 3C:
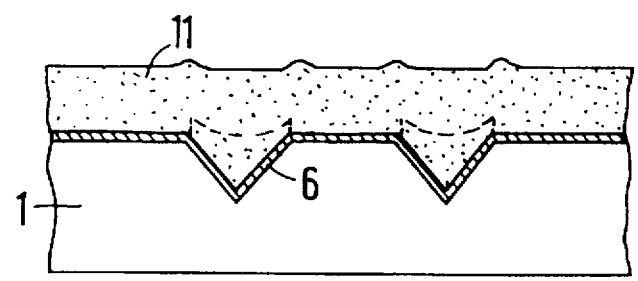
Figure 3D:
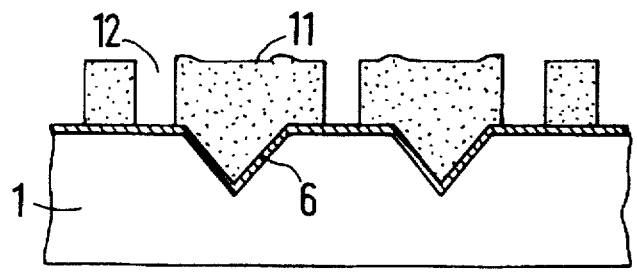

FIG. 3C illustrates the substrate 1 after a new layer 11 of photoresist has been applied. The photoresist layer 11 on the substrate 1 illustrated in FIG. 3D has been exposed through a mask, the exposed part of the photoresist layer 11 has been developed and removed. The result are the depressions 12 in the photoresist layer 11, which extend down to the metal layer 6.

Figure 3E:
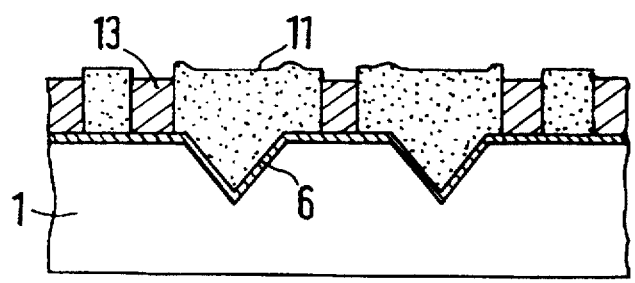
Figure 3F:
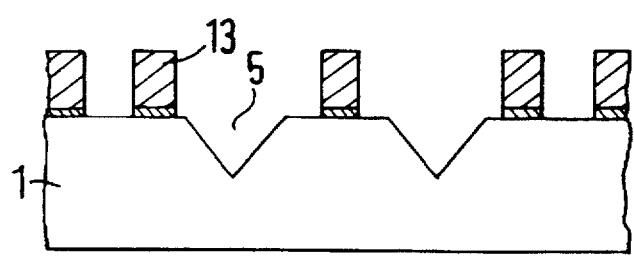

FIG. 3E illustrates the substrate 1 after a metal layer 13 has been deposited in the depressions 12. The photoresist layer 11 and part of the metal layer 6 on the substrate 1 illustrated in FIG. 3F have been removed by means of differential etching.

However, it is also possible to form the conductive paths and/or contact bumps in accordance with another known photolithographic method, starting with the substrate 1 according to FIG. 3B.

Although the invention has been shown and described with respect to a best mode embodiment thereof, it should be understood by those skilled in the art that the foregoing and various other changes, omissions and additions in the form and detail thereof may be made therein without departing from the spirit and scope of the invention.

We claim:

1. A method of forming conductive paths of an electrically conductive material adjacent an end of V-grooves in a substrate that is covered with a metal layer (6), characterized by:

covering the metal layer (6) with a layer of a plastic material (7), wherein said covering includes closing the V-grooves (5) thereby forming closed V-grooves;

forming an opening (8) in the selected material to expose the metal layer (6) at said selected distance;

filling said opening with metal to form a column of metal (9) from said metal layer to a surface level of said layer of plastic material (7);

forming said conductive paths (4) on the layer of selected material and on the column of metal at said selected distance; and opening the closed V-grooves for insertion of an optical fiber (3).

2. A method as claimed in claim 1, characterized by said step of covering comprising covering the depressions with a plastic sheet (7) as said material.

3. A method as claimed in claim 2, characterized by said step of forming said conductive paths comprising forming said conductive paths on the plastic sheet which together comprise a radio-frequency line in the form of a microstrip.

4. A method as claimed in claim 2, characterized in that the plastic sheet is made of a polyimide.

5. A method as claimed in claim 2, characterized in that the plastic sheet is made of a fluorocarbon polymer.

6. A method as claimed in claim 2, characterized in that a radio-frequency line in the form of a microstrip is formed from the conductive paths (4) and the plastic sheet (7).

7. A method as claimed in claim 1, characterized in that after the formation of the conductive paths (4), contact bumps are formed on the conductive paths.

8. A method as claimed in claim 7, characterized in that the plastic material (7) is a plastic sheet made of a polyimide.

9. A method as claimed in claim 7, characterized in that the plastic material (7) is a plastic sheet made of a fluorocarbon polymer.

* * * * *

UNITED STATES PATENT AND TRADEMARK OFFICE
CERTIFICATE OF CORRECTION

PATENT NO. : 5,783,368
DATED : July 21, 1998
INVENTOR(S) : Richter et al

It is certified that error appears in the above-identified patent and that said Letters Patent is hereby corrected as shown below:  On the title page: Item

[56], line 14, please cancel "221507" and substitute --2215087--.

Signed and Sealed this

Tenth Day of November 1998

Attest:

BRUCE LEHMAN

*Attesting Officer*    *Commissioner of Patents and Trademarks*